(12) United States Patent
Crescini

(10) Patent No.: US 12,204,000 B2
(45) Date of Patent: Jan. 21, 2025

(54) PRECISION MAGNETOMETER

(71) Applicant: ISTITUTO NAZIONALE DI FISICA NUCLEARE (I.N.F.N.), Frascati (IT)

(72) Inventor: Nicolo' Crescini, Frascati (IT)

(73) Assignee: ISTITUTO NAZIONALE DI FISICA NUCLEARE (I.N.F.N.), Frascati (IT)

( * ) Notice: Subject to any disclaimer, the term of this patent is extended or adjusted under 35 U.S.C. 154(b) by 141 days.

(21) Appl. No.: 17/925,397

(22) PCT Filed: May 21, 2021

(86) PCT No.: PCT/IB2021/054426
§ 371 (c)(1),
(2) Date: Nov. 15, 2022

(87) PCT Pub. No.: WO2021/234656
PCT Pub. Date: Nov. 25, 2021

(65) Prior Publication Data
US 2023/0184850 A1    Jun. 15, 2023

(30) Foreign Application Priority Data
May 22, 2020 (IT) .................. 102020000012016

(51) Int. Cl.
*G01R 33/00* (2006.01)
*G01R 33/02* (2006.01)
(52) U.S. Cl.
CPC ......... *G01R 33/0017* (2013.01); *G01R 33/02* (2013.01)

(58) Field of Classification Search
CPC .... G01R 33/0017; G01R 33/02; G01R 33/24; G01R 33/60; G01R 33/032
See application file for complete search history.

(56) References Cited

U.S. PATENT DOCUMENTS

| | | | | |
|---|---|---|---|---|
| 5,500,995 A | * | 3/1996 | Palmieri | .................. H05H 7/20 29/599 |
| 2016/0041233 A1 | * | 2/2016 | Li | ...................... G01R 33/0017 324/202 |
| 2020/0064419 A1 | | 2/2020 | Barry et al. | |
| 2021/0208231 A1 | * | 7/2021 | Lachance-Quirion | ....................... G01R 33/323 |

FOREIGN PATENT DOCUMENTS

JP        2016075665 A      5/2016
WO    WO-2016139419 A1 *  9/2016 ............. G01N 24/10

OTHER PUBLICATIONS

International Search Report issued on Sep. 22, 2021, in connection with corresponding International Patent Application No. PCT/IB2021/054426; 2 pages.
Audrey Bienfait, "Magnetic Resonance With Quantum Microwaves", Université Paris Saclay, 2016, 186 pages.

* cited by examiner

*Primary Examiner* — Lee E Rodak
*Assistant Examiner* — Demetrius R Pretlow
(74) *Attorney, Agent, or Firm* — Maier & Maier, PLLC

(57) ABSTRACT

A precision magnetometer for detecting magnetic fields parallel to a static field $B_0$ in which the magnetometer itself is immersed; this magnetometer is operative in the frequency range of the field $b_1$ ranging from 10 MHz to 1 GHz. Another object is a technique for using the presented magnetometer.

9 Claims, 1 Drawing Sheet

PRECISION MAGNETOMETER

TECHNICAL FIELD

The present invention relates to the field of magnetometers and methods for using them.

BACKGROUND

The detection of ultra-low magnetic fields, i.e. of the order of femtotesla ($10^{-15}$ T), is along-standing technological challenge that has involved numerous research groups. The most sensitive known detectors include the superconductive quantum interference devices also known as (SQUIDs). Such devices achieve a level of sensitivity of the order of fT/$\sqrt{Hz}$ however, being based on Josephson junctions, cryogenic temperature conditions are required for their operation in order for the superconductive state to be achieved. The limited operability at cryogenic temperature conditions is a major limitation in several application fields as well as being the cause of a more complex functionality of the SQUID-type magnetometers.

A state-of-the-art alternative, capable of operating at room temperature, is offered by the laser-readable atomic magnetometers also known as Spin Exchange Relaxation-Free (SERF) magnetometers. Although SERF-type magnetometers reach sensitivity levels slightly below fT/$\sqrt{Hz}$ and can be used at frequencies of up to hundreds of MHz, they remain complex objects both in terms of construction and applicability because they are characterized by a large size.

There is therefore a need for a precision magnetometer capable of operating at room temperature conditions and of reaching sensitivity levels at least equal to the order of the femtotestla.

OBJECTS AND SUMMARY OF THE INVENTION

An object of the present invention is to overcome the disadvantages of the prior art.

It is an object of the present invention a precision magnetometer for detecting magnetic fields parallel to a static field $B_0$ in which the magnetometer is immersed. Further characteristics of the instrument will be clarified in the course of the description and the claims.

It is also an object of the present invention to provide a method for using the magnetometer according to the above specifications.

DETAILED DESCRIPTION OF THE EMBODIMENTS

Figure 1:
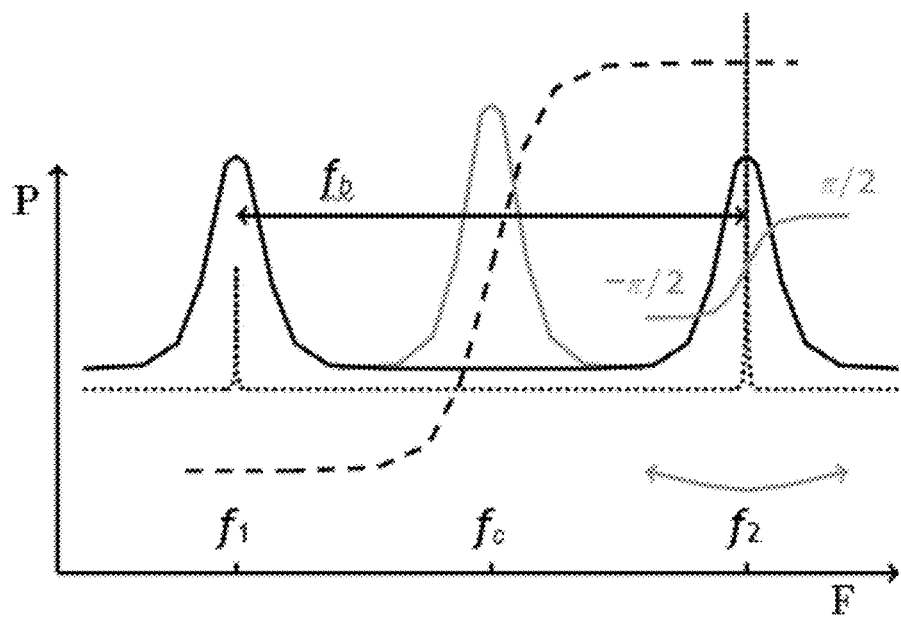
FIG. 1 illustrates the operating principle of the precision magnetometer according to the present invention.

The magnetometer according to the present invention exploits the principle of field modulation on which electron spin resonance measurements also known as ESR (Electron Spin Resonance) are generally based. In the presence of a static type external magnetic field $B_0$ the spins of a magnetic material follow a precession motion at the Larmor frequency $f_L=\gamma B_0$, where $\gamma=28$ GHz/T is the electron gyromagnetic ratio.

If the magnetic field $B_0$ was modulated by an oscillating magnetic field, parallel thereto, of lower intensity with amplitude $b_1$ and frequency fixed at $f_B$, the resulting field would be $B=B_0+b_1 \sin(2\pi f_B t)$. Generally, the static magnetic field $B_0$ has values approximately equal to fractions of Tesla, preferably between 0.2 and 0.5 T; this determining working frequencies in the range of 5 to 15 GHz.

According to the working principle of the magnetometer, it is possible to detect the presence of possible oscillating magnetic fields $b_1$, parallel to the static field $B_0$, through observation of sidebands respectively coinciding with the frequencies $f_L \pm f_b$ induced by the presence of a pump in resonance with the Larmor frequency $f_L$.

In terms of field strength, the following relationship must apply $b_1 * Q \ll B_0$. Outside these conditions, the operation of the magnetometer is not guaranteed. In general, the operability range of the magnetometer can be considered to be from microtesla to femtotesla.

The sensitivity of the magnetic field can be calculated as $$\sigma_b = \frac{2B_0}{\pi Q} \sqrt{\frac{A_n^2}{A_p^2}},$$

where Q is the resonance quality factor and $A_p^2$ is the applied pump power.

To increase the sensitivity of the magnetometer, the magnetic material (hereafter also referred to as sensitive material) can be coupled to a resonator such as for example a microwave resonant cavity at frequency $f_C=f_L$. The resulting system is known as a hybrid system because the photons in the cavity are strongly coupled to the spins of the magnetic material inside.

The use of a resonator has the dual effect of removing the line broadening that leads to a deterioration of the quality factor Q, an effect known as radiation damping, and of separating the main resonance into two frequencies $f_1$ and $f_2$ of the order of tens of GHz. The quality factors of the two modes to which these frequencies correspond result from the average of the quality factors Q of the magnetic material and the resonator respectively, while their separation is proportional to their coupling, which can be in the order of tens or hundreds of MHz.

By way of example only, setting a pump to frequency $f_2$ makes it possible to search for bands at frequency $f_1$ without disturbing detection sensitivity. This is also true for the other way round since the definition of $f_1$ and $f_2$ is arbitrary and they can be exchanged between them without going beyond the scope of protection of this patent. This separation between the pump frequency and the detection frequency also enables noise filtering operations to be carried out, for example by using a waveguide with a threshold value between $f_1$ and $f_2$ and consequently lowering the value $A_n^2$.

Once $B_0$ is fixed, the bandwidth of the magnetometer, i.e. the frequency range at which the magnetometer can operate, is equal to the linewidth of the hybrid resonance $f_1/Q$. However, this can be modified by orders of magnitude by acting on the static magnetic field $B_0$ and the pump frequency.

With reference to FIG. 1, the operating frequencies of the magnetometer are shown. The x-axis represents the frequencies (in the order of GHz) and the y-axis represents the power (in arbitrary units). The continuous black line shows the two resonances of the hybrid system that are symmetrical to the resonator 5 in grey. The dotted line indicates the frequency at which the pump 13 is applied, and that of the signal (sideband) induced by the field $b_1$ at the frequency $f_1 = f_2 - f_b$. The dotted line represents the filter 9 used to attenuate the pump noise, while the remaining greyed parts show the phase modulation induced on the pump by $b_1$.

The magnetometer comprises:
- a volume of sensitive material 6;
- a resonator 5 within which said volume of sensitive material 6 is placed;
- at least a magnetic element 7 for generating a static field $B_0$;
- a field transducer 4 for transmitting a radiofrequency signal to the sensitive material 6;
- a system for generating 13 and transmitting 12 a pump signal to the resonator 5;
- a low noise amplifier 8 for amplifying the radiofrequency signal.

For this instrument, it is important to have a strong coupling between the material and the resonator as this increases the separation between the two resonances $f_1$ and $f_2$, thus allowing a better noise reduction. A high spin density in the material means that the electromagnetic field of the resonator 5 is more likely to interact with the polarised spins of the sensitive material 6. Another way for increasing the coupling is to concentrate the electromagnetic field of the resonator 5 on the sensitive material 6, increasing again the probability of interaction. It therefore becomes clear that a high spin density (e.g., equal to $10^{22}/cm^3$) makes it possible to operate with sample sizes of sensitive material 6 of the order of a millimetre, using a resonator as a 3D microwave cavity.

The sensitive material 6 is any magnetic insulating material. Preferably the sensitive material 6 can be selected from any one, or their combinations, of the materials known as ferromagnetic insulators such as for example Yttrium iron garnet (YIG) or Lithium ferrite (LiFe), paramagnetic materials, matrices comprising NV centres or molecular spins. In general, long coherence times and high spin densities are preferable for improving the quality factor and the resonator material coupling.

For the purposes of the present invention, NV centres are defined as nitrogen vacancies in diamonds, i.e., negatively charged point defects whose electronic spins have coherence times even higher than one millisecond up to reaching about 1 second. Further information on this subject is presented in Bar-Gill, N., Pham, L., Jarmola, A. et al. Solid-state electronic spin coherence time approaching one second. *Nat Commun* 4, 1743 (2013).

A molecule with a low-energy fundamental state possesses a spin, called molecular spin, which can be well isolated from the excited levels, and consequently has a coherence time of the millisecond. Further information on the so-called molecular spins has been presented in Gaita-Ariño, A., Luis, F., Hill, S. et al. Molecular spins for quantum computation. *Nat. Chem.* 11, 301-309 (2019).

Each category of the usable materials has specific properties that make them more or less suitable for certain applications. The ferromagnetic compounds are readily available, particularly easy to couple to the resonator and have quality factors Q of the order of $10^4$; this class of compounds shows limited improvements in performance at cryogenic temperatures, i.e., improvements of less than a factor of two. The paramagnetic compounds have high spin densities ($10^2/cm^3$) and high Q values ($10^5$); NV centres have Q values in excess of one million but, in contrast, have low spin densities (less than $10^{20}$ spin/$cm^3$) and need tight couplings with the resonator to achieve coupling conditions; the molecular spins have large dipole moments and high Q values (greater than one million) but, like NV centres, they need tight couplings with the resonator to achieve coupling conditions.

The resonator 5 converts the magnetisation signal of the sensitive material into a radio frequency signal which is then acquired and amplified by the amplifier 8. Examples of resonators for this purpose consists of the cavities made of copper or of superconductive material, co-planar waveguides and cavities of dielectric material. The copper cavities have Q values approximately equal to $10^4$, while those made of superconductive or dielectric material have much higher values, i.e., $10^6$. All cavities, whereby a cavity is defined as any volume confined by a conductive material, have in common the ease of coupling with the sensitive material 6. It should be noted that the cavities made of superconductive material require operation under cryogenic temperature conditions, while those made of copper show limited improvements, up to a factor of four, in performance as the temperature decreases. One advantage of the co-planar waveguides lies in the fact that they are easy to couple even with small volumes of sensitive material 6, but they have low Q values, around 100 at room temperature, a problem that is largely solved by dropping to cryogenic temperatures.

The choice of sensitive material 6 and of the resonator 5 depends on the intended use of the magnetometer; the person skilled in the art is able to produce the magnetometer that best suits the work requirements on the basis of the data available in the state of the art. By way of example, if a high sensitivity magnetometer at a precise frequency is required, it would be advantageous to use sensitive materials and high Q resonators; a cryogenic magnetometer would instead allow to use higher pump powers and a better signal-to-noise ratio.

Another way to increase the sensitivity of the magnetometer is to use a higher power pump. The dissipation of the pump is simpler under cryogenic conditions and is approximately equal to the fraction $1/Q$ of the input power. In general, an open type resonator, such as co-planar waveguides, are more suitable for the couplings with a transducer although more difficult to be maintained stable when using a high-power pump.

As a further example, an apparatus optimised for operation at room temperature could be composed of a resonator 5 made of a dielectric material coupled to a sensitive material 6 such as diamond NV centres. These two physical systems make it possible to achieve quality factors Q of the order of $10^5/10^6$ and it can be assumed that a coupling higher than 50 MHz can be reached.

The magnetic element 7 must be such that it satisfies the condition of a homogeneous magnetic field over the whole volume of the sensitive material where homogeneity is expressed in ppm and is at least equal to $10^6/Q$ with Q corresponding to the resonance quality factor. Permanent magnets such as neodymium magnets and/or electromagnets can be used to generate the field $B_0$.

The field transducer 4 for transmitting a radio frequency signal to the sensitive material 6 is generally applied to the resonator 5. Said transducer 4 is arranged to couple to a calibration system which may comprise, by way of example, a radio frequency signal generator 1 (or calibration signal), a load for reading the current circulating in the calibration coil 2 and an oscilloscope for measuring the frequency and the amplitude of the calibration signal 3. As a result, said calibration system is arranged to couple with the transducer 4. This arrangement allows the magnetometer to be calibrated before it is exposed to oscillating magnetic fields for detection and/or analysis thereof. It is within the scope of the present invention to provide a precision magnetometer comprising itself the radio frequency signal generator 1, the load for reading the current circulating in the calibration coil 2 and the oscilloscope for measuring the frequency and the amplitude of the calibration signal 3.

In a preferred embodiment of the invention, the system for generating 13 and transmitting 12 a pump signal to the resonator 5 comprises a microwave oscillator which generates a radiofrequency signal transmitted to the resonator 5 by means of a waveguide 12.

The low noise amplifier 8 for amplifying the radiofrequency signal consists in a GHz amplifier whose noise temperatures are lower than the working temperature of the magnetometer. The function of the amplifier 8 is to amplify the signal output from the magnetometer, which will then be acquired by a spectrum analyser.

Generally, the amplifier 8 is provided with a radio frequency output cable, preferably an SMA type cable, suitable for the connection to the spectrum analyser 11 and/or to processors comprising said spectrum analyser.

The precision magnetometer may comprise some optional elements such as a filter 9 for reducing the pump signal placed upstream or downstream of the amplifier 8 as well as a second amplifier with the function of improving the performance of the magnetometer in terms of sensitivity and/or precision.

In a particularly advantageous embodiment of the precision magnetometer, it further comprises a heterodyne or equivalent element connected at the output of the low noise amplifier 8 to reduce the output frequency therefrom and facilitate the reading thereof, and to allow measurements sensitive to magnetic fields $b_1$ which are varying in an arbitrary range of frequencies.

The operation of the magnetometer described above comprises the following main steps:
 Arranging a magnetometer of the invention exposed to a static-type magnetic field $B_0$;
 Actuating the system for generating 13 and transmitting 12 a pump signal to the resonator 5;
 Verifying if one or more oscillating magnetic fields, parallel to $B_0$, are present or not by means of analysing the radiofrequency signal output from the low noise amplifier 8.

Optionally, it is possible to perform preliminary calibration operations of the magnetometer by exposing it to known oscillating magnetic fields, parallel to $B_0$, and by recording the respective signals output from the low noise amplifier 8 in the presence of the pump signal.

The person skilled in the art is able to perform said calibration step and to assess the number of acquisitions required in order to obtain a calibration curve useful for the purposes of the magnetic field measurement to be carried out by means of the magnetometer of the invention.

Figure 2:
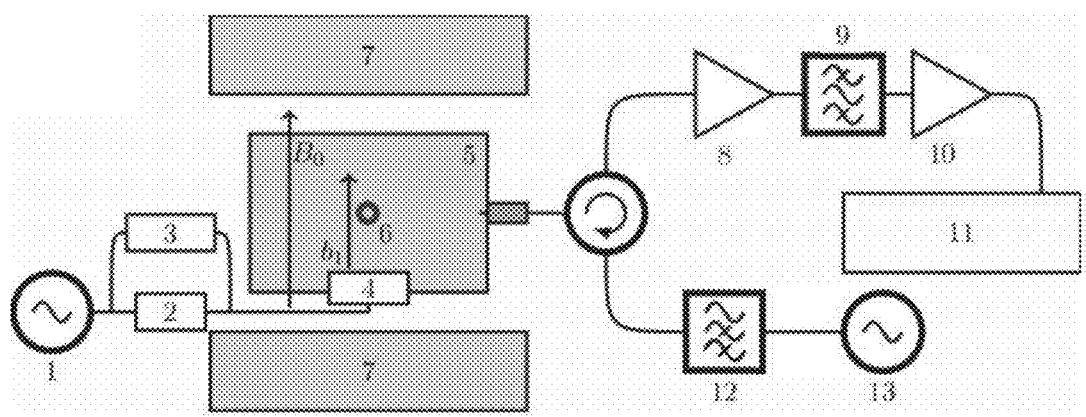
FIG. 2 shows a schematic representation of a preferred embodiment of the precision magnetometer.

For the purposes of calibrating the magnetometer, the field transducer 4 suitable for transmitting a radio frequency signal to the sensitive material 6 may be coupled to a radio frequency signal generator 1 through a load 2 for reading the circulating current signal and to an oscilloscope 3 suitable for measuring the frequency and the amplitude of the transmitted signal for calibration purposes. The system comprising the above elements is shown in FIG. 2 although it constitutes a preferred, non-limiting embodiment for the magnetometer of the invention.

In fact, the precision magnetometer can be made and sold without the components used to calibrate it, and possibly already calibrated. In this case the magnetometer would be ready to be used for magnetic field detection.

The signal output from the low noise amplifier 8 consists of a signal at frequency $f_1$, frequency at which the sideband induced by the field to be detected (a peak coming out of the white noise) is sought. The presence of this peak indicates that there is a magnetic field that modulates $B_0$ at frequency $f_b$ in the order of tens of MHz, up to GHz. The frequency of this signal can be lowered using a standard heterodyne, so that it can be acquired more easily. Once brought to low frequencies this can be displayed via an analogue-to-digital converter or connected to a lock-in amplifier to search for particularly weak signals.

The step of analysing the signal can be performed using a computer. The precision magnetometer is arranged to be connected to a spectrum analyser 11 and/or to computers comprising said spectrum analyser, preferably by means of an SMA-type cable.

The person skilled in the art is therefore able to conduct an analysis of the resulting spectrum obtaining information on the frequency, the amplitude and phase of the signal; therefore, it is believed that the signal can be completely analysed with extreme simplicity.

Example

A prototype implementation of the magnetometer of the invention is described below in detail with particular reference to the schematic representation of FIG. 2.

The magnetic material 6, or sensitive material, used in the prototype construction is Yttrium iron garnet, also known as YIG (Yttrium Iron Garnet), in the form of a sphere with a diameter of 2 millimetres.

The resonator 5 coupled to the YIG sphere is a resonant copper cavity with a resonant frequency of about 11.5 GHz. A quartz tube holds the YIG sphere in place in the centre of the cavity, which is magnetised thanks to permanent magnets that produce a field of about 0.4 T. The two frequencies of the hybrid modes are $f_1$=11.33 GHz and $f_2$=11.55 GHz, so the coupling is 220 MHz, which corresponds to the frequency to which the magnetometer is sensitive $f_b$. The transducer 4 consists of a single turn coil, inserted into a hole in the wall of cavity 5, and is used to test and calibrate the instrument. A single antenna is coupled to the cavity 5 and is used to send the pump signal to $f_2$ and to collect the sideband signal at $f_1$. A self-produced waveguide 12 was used to filter the noise, reducing the amplitude of the transmitted noise below the cut-off frequency situated between $f_1$ and $f_2$. The reduction in pump noise is such that the remaining thermodynamic noise is measured. The sideband signal collected at frequency $f_1$ is amplified by an amplifier 8 with lower noise than the thermodynamic one. Downstream of this, a band-pass filter 9 was used, useful for reducing any unwanted signals (such as that of the pump reflected at frequency $f_2$) which would compromise the dynamics of the second amplifier 10. After the latter, the signal is acquired with a spectrum analyser 11.

After calibrating the transducer 4, it is used to modulate the static field $B_0$ at frequency $f_b$, then it is measured in the form of a sideband through the amplification chain and then the magnetometer is calibrated. The characteristics of sensitive material 6 and resonant cavity 5 give a quality factor of 2500, the available pump power is 0.3 mW, and the thermal noise is $5*10^{-21}$ W/Hz, so the expected sensitivity is 2.4 pT/rt(Hz). The calibration procedure gives a measured sensitivity of 2.9 pT/rt(Hz), which is widely compatible with that estimated.

This result confirms the correct functioning of the magnetometer, as well as the validity of the model used to calculate sensitivity.

Advantages

The magnetometer of the invention exhibits performance characteristics that do not depend on any extensional property thereof, such as for example the volume of the sensitive material 6. A particularly advantageous effect therefore lies in the fact that it is possible to make magnetometers of reduced size, e.g., a magnetometer based on YIG and a co-planar resonator may have sizes of a few centimetres, where the sensitive material is a sphere with a diameter of around one millimetre.

With such a magnetometer, it is further possible to make precise detections even under room temperature conditions. The choice of the sensitive material 6 and of the resonator 5, within the reach of the person skilled in the art, makes it possible to obtain special embodiments, whose performance is not affected by temperature variations. Among other possibilities, the measurement sensitivity can be increased significantly by acting on the pump power and, thanks to the increased quality factor of the hybrid system, there is no need to work at low temperatures.

As can be seen from the description of the operation of the magnetometer and of its use, it is easy to use and is also suitable for in situ measurements. The spectrum recorded by the reading system can further be acquired and stored on a physical medium for later processing.

The magnetometer operates over a wide range of field frequencies $b_1$ ranging from 10 MHz to 1 GHz. The person skilled in the art is able to extend this operating range by acting on parameters such as the static field $B_0$, the pump frequency $f_2$ and the frequency of a possible heterodyne. In fact, it is possible to design the system so that it autonomously varies the static field and makes a measurement for each different working frequency, making it to all intents and purposes a broadband object.

Another advantage of the magnetometer lies in the fact that it is characterised by variable input impedance values and consequently, it allows any type of collecting coil to be used. The best transduction occurs when the signal collection coil has an inductance equal to that of the coil internal to the magnetometer. Since the field signal is brought on the sensitive material 6 by means of a transducer 4, this can be designed suitably sized and shaped. The geometry thereof influences its inductance, which can therefore be variable. This is not true for many electronic components such as the amplifiers with 50 Ohm input impedance, and is partially true for SQUIDs which, being micrometric devices, maximise performance with similarly sized input coils.

The invention claimed is:

1. A precision magnetometer comprising:
    a volume of sensitive material;
    a resonator within which the volume of sensitive material is placed;
    at least a magnetic element for generating a static-type magnetic field $B_0$;
    a field transducer for transmitting a radiofrequency signal to the sensitive material;
    a system for generating and transmitting a pump signal to the resonator; and
    a low noise amplifier for amplifying the radiofrequency signal; and
    a calibration system arranged to couple with the transducer, the calibration system comprising:
        a radiofrequency signal generator;
        a load for reading the current circulating in a calibration coil; and
        an oscilloscope for measuring the frequency and the amplitude of a calibration signal.

2. The magnetometer according to claim 1, wherein the sensitive material is selected from any one, or their combinations, ferromagnetic insulators.

3. The magnetometer according to claim 1, wherein the resonator consists of a cavity made of copper or of a superconductive material or of a dielectric material.

4. The magnetometer according to claim 1, wherein the resonator consists of co-planar waveguides.

5. The magnetometer according to claim 1, wherein the system for generating and transmitting the pump signal to the resonator comprises:
    a microwave oscillator which generates a radiofrequency signal transmitted to the resonator through a waveguide.

6. The magnetometer according to claim 1, wherein the low noise amplifier for amplifying the radiofrequency signal comprises a GHz amplifier whose noise temperatures are lower than the working temperature of the magnetometer.

7. The magnetometer according to claim 1, further comprising a heterodyne connected at the output of the low noise amplifier to reduce the frequency output of the low noise amplifier.

8. A method for using the magnetometer according to claim 1, comprising:
    arranging the magnetometer of claim 1 to be exposed to the static-type magnetic field $B_0$;
    actuating the system for generating and transmitting the pump signal to the resonator; and
    verifying if one or more oscillating magnetic fields, parallel to $B_0$, are present by analysing the radiofrequency signal output from the low noise amplifier.

9. The method according to claim 8, further comprising:
    performing preliminary calibration operations of the magnetometer by exposing it to known oscillating magnetic fields, parallel to $B_0$; and
    recording the signals output from the low noise amplifier in the presence of the pump signal.

* * * * *